US012635206B2

(12) United States Patent
Jung et al.

(10) Patent No.: US 12,635,206 B2
(45) Date of Patent: May 19, 2026

(54) POWER SEMICONDUCTOR DEVICE AND MANUFACTURING METHOD THEREOF

(71) Applicant: DB HiTek Co., Ltd., Bucheon-si (KR)

(72) Inventors: Ji Houn Jung, Seoul (KR); Dae Il Kim, Cheongju-si (KR); Han Seok Ko, Seoul (KR); Ung Bi Son, Bucheon-si (KR)

(73) Assignee: DB HiTek Co., Ltd., Bucheon-si (KR)

( * ) Notice: Subject to any disclaimer, the term of this patent is extended or adjusted under 35 U.S.C. 154(b) by 489 days.

(21) Appl. No.: 18/304,444

(22) Filed: Apr. 21, 2023

(65) Prior Publication Data

US 2024/0243176 A1     Jul. 18, 2024

(30) Foreign Application Priority Data

Jan. 13, 2023    (KR) ........................ 10-2023-0005229

(51) Int. Cl.
| | |
|---|---|
| *H10D 62/85* | (2025.01) |
| *H10D 30/01* | (2025.01) |
| *H10D 30/47* | (2025.01) |
| *H10D 62/10* | (2025.01) |
| *H10D 62/17* | (2025.01) |

(52) U.S. Cl.
CPC ....... *H10D 62/8503* (2025.01); *H10D 30/015* (2025.01); *H10D 30/475* (2025.01); *H10D 30/4755* (2025.01); *H10D 62/106* (2025.01); *H10D 62/343* (2025.01)

(58) Field of Classification Search
CPC ............. H10D 62/8503; H10D 30/015; H10D 30/475; H10D 62/106; H10D 62/343; H10D 30/4755; H10D 64/111; H10D 64/112; H10D 64/115
See application file for complete search history.

(56) References Cited

U.S. PATENT DOCUMENTS

| | | | |
|---|---|---|---|
| 9,640,649 B2 * | 5/2017 | Beach | ................ H10D 30/4755 |
| 10,680,069 B2 | 6/2020 | Haeberlen et al. | |
| 2009/0152649 A1 * | 6/2009 | Kim | ....................... H10D 30/60 257/E47.001 |
| 2014/0138704 A1 | 5/2014 | Tanaka et al. | |
| 2017/0194471 A1 * | 7/2017 | Pei | ....................... H10D 62/103 |
| 2018/0138306 A1 * | 5/2018 | Jeon | ....................... H10D 30/015 |
| 2023/0335630 A1 * | 10/2023 | Lin | ....................... H10D 64/112 |

FOREIGN PATENT DOCUMENTS

| | | |
|---|---|---|
| CN | 113871480 A | 12/2021 |
| JP | 2015-179785 A | 10/2015 |
| JP | 2021-508944 A | 3/2021 |
| KR | 10-2020-0068745 A | 6/2020 |

* cited by examiner

*Primary Examiner* — Jessica S Manno
*Assistant Examiner* — Bipana Adhikari Dawadi
(74) *Attorney, Agent, or Firm* — Bridgeway IP Law Group, PLLC; Jihun Kim

(57) ABSTRACT

A power semiconductor device and its manufacturing method are proposed. Specifically, the device features a plurality of guard rings formed on the separation space between the gate electrode and drain electrode. These guard rings inject holes into the channel layer, which capture trapped electrons and prevent the occurrence of a current collapse effect. By reducing the concentration of the electric field at the edge of the drain electrode, this power semiconductor device ensures the reliability of the device.

12 Claims, 14 Drawing Sheets

POWER SEMICONDUCTOR DEVICE AND MANUFACTURING METHOD THEREOF

CROSS REFERENCE TO RELATED APPLICATION

The present application claims priority to Korean Patent Application No. 10-2023-0005229, filed Jan. 13, 2023, the entire contents of which are incorporated herein for all purposes by this reference.

BACKGROUND OF THE INVENTION

Field of the Invention

The present disclosure pertains to a power semiconductor device and its manufacturing method. Specifically, the present disclosure relates to a power semiconductor device and a manufacturing method thereof that includes forming multiple guard rings in a separation space between a gate electrode and a drain electrode. This formation enables the injection of holes in a channel layer, which captures trapped electrons and prevents the occurrence of current collapse effects. As a result, the power semiconductor device ensures device reliability by reducing the concentration of the electric field at the edge side of the drain electrode.

Description of the Related Art

A nitride semiconductor is commonly used in semiconductor devices with high withstand voltage and high output power due to its properties such as high saturation electron velocity and a wide band gap. Particularly, gallium nitride (GaN) stands out with its wider band gap and higher breakdown electric field compared to silicon and gallium arsenide (GaAs), making it an excellent choice for transistor applications.

In addition, GaN-based devices exhibit higher electron mobility and saturation velocity than their silicon-based counterparts, which leads to superior high frequency performance. The higher electron mobility also contributes to improved on-resistance characteristics in GaN devices, enabling the realization of low-loss switching elements.

Given these advantages, research on GaN-based Field Effect Transistor (FET) has been ongoing, particularly for high frequency and high power applications. There has been a significant amount of research and development in recent years on GaN-based FET. However, there are still several issues related to device reliability that needs to be addressed. One critical problem is the current collapse effect caused by a trap present in the semiconductor.

FIG. 1 shows a partial cross-sectional view of a conventional power semiconductor device.

Hereinafter, a schematic structure and problems of a conventional power semiconductor device 9 will be described with reference to the attached drawing.

Referring to FIG. 1, in a conventional power semiconductor device 9, a voltage higher than the voltages applied to a source electrode 910 and agate electrode 930 can be applied to a drain electrode 950. In this situation, carriers can become trapped between the gate electrode 930 and the drain electrode 950, leading to a current collapse effect caused by corresponding carrier traps. This effect can cause a "memory" effect, in which the conduction current of the device may vary depending on the duration of a previously applied voltage. For instance, during transistor operation, electrons can become trapped in an epitaxial layer or a dielectric layer. The trapped electrons can push electrons moving through a channel, making it difficult for a current to pass through a 2 DEG layer 970, resulting in an increase in channel resistance.

To address these problems, the inventors of the present disclosure have developed a new power semiconductor device and a manufacturing method thereof that improve the device's structure. A detailed description of the new device and method will be described later on.

DOCUMENT OF RELATED ART (Patent Document 1) Korean Patent Application Publication No. 10-2020-0068745 'HIGH ELECTRON MOBILITY TRANSISTOR'

SUMMARY OF THE INVENTION

The present disclosure aims to address the problems encountered in the related art mentioned above. Specifically, an objective of the present disclosure is to provide a power semiconductor device and a manufacturing method that can prevent a current collapse effect by forming multiple guard rings in a separation space between a gate electrode and a drain electrode. The guard rings inject holes in the channel layer to capture trapped electrons, thereby reducing the concentration of the electric field at the edge side of the drain electrode. This approach ensures device reliability and stability.

Furthermore, another objective of the present disclosure is to provide a power semiconductor device and a manufacturing method that includes forming a first guard ring between the gate electrode and the drain electrode. This approach helps to minimize the memory effect since holes injected in the channel are coupled with trapped electrons, reducing the electrical resistance of the device.

Moreover, another objective of the present disclosure is to provide a power semiconductor device and a manufacturing method that includes forming a second guard ring between the gate electrode and the drain electrode, thereby controlling impact ionization according to thickness adjustment of the second guard ring, reducing concentration of the electric field at the edge side of the drain electrode, and improving breakdown voltage characteristics of the device.

Additionally, another objective of the present disclosure is to provide a power semiconductor device and a manufacturing method that includes forming a first guard ring during the capping layer forming process, thereby preventing process efficiency deterioration.

Furthermore, another objective of the present disclosure is to provide a power semiconductor device and a manufacturing method that includes forming a second guard ring simultaneously when a barrier layer at positions corresponding to the source electrode and the drain electrode is etched, thereby maximally preventing process efficiency deterioration due to the addition of the second guard ring.

To achieve one or more of the above-described objectives, the present disclosure may be implemented by one or more embodiments having some or all of the following configurations.

According to an embodiment of the present disclosure, a power semiconductor device includes: a substrate; a channel layer disposed on or over the substrate; a barrier layer disposed on the channel layer; a capping layer disposed on the barrier layer; a gate electrode disposed on the capping layer; a source electrode and a drain electrode that are separated from the gate electrode, the source electrode and the drain electrode forming ohmic contact regions on the channel layer; a first guard ring of a first conductivity type disposed on the barrier layer, the first guard ring being disposed between the gate electrode and the drain electrode; and a second guard ring of the first conductivity type disposed on the barrier layer, the second guard ring being disposed between the gate electrode and the first guard ring.

In the present disclosure, the second guard ring may be spaced apart from the first guard ring.

In the present disclosure, the second guard ring may have a thickness less than a thickness of the first guard ring.

In the present disclosure, the second guard ring may have an upper surface positioned at a level lower than positions of upper surfaces of the first guard ring and the gate electrode.

In the present disclosure, the drain electrode may be electrically connected to the first guard ring and the second guard ring.

In the present disclosure, at least a portion of a bottom surface of the source electrode may be in direct contact with the channel layer, and at least a portion of a bottom surface of the drain electrode may be in direct contact with the channel layer.

In the present disclosure, the first guard ring and the second guard ring may form doped regions doped with first conductivity type impurities.

According to another embodiment of the present disclosure, a power semiconductor device includes: a substrate; a channel layer disposed on or over the substrate, the channel layer having surfaces directly contacting a source electrode and a drain electrode; a barrier layer disposed on the channel layer; a capping layer of a first conductivity type disposed on the barrier layer; a gate electrode disposed on the capping layer; a first guard ring of the first conductivity type disposed on the barrier layer, the first guard ring being disposed between the gate electrode and the drain electrode; and a second guard ring of the first conductivity type disposed on the barrier layer, the second guard ring being disposed between the gate electrode and the first guard ring, wherein the source electrode is disposed on the channel layer, and wherein the drain electrode has a first surface directly contacting the channel layer, a second surface directly contacting the first guard ring, and a third surface directly contacting the second guard ring.

In the present disclosure, the first guard ring may be formed substantially simultaneously with the capping layer.

In the present disclosure, the second guard ring may be formed when the barrier layer on the channel layer is etched.

In the present disclosure, the second guard ring may have a substantially uniform thickness, and the second guard ring may have the thickness less than a thickness of the first guard ring.

In the present disclosure, the power semiconductor device may further include an insulation film disposed between the first guard ring and the drain electrode.

According to an embodiment of the present disclosure, a method for manufacturing a power semiconductor device includes: forming a channel layer on or over a substrate, wherein the channel layer is a nitride-based semiconductor layer; forming a barrier layer on the channel layer, wherein the barrier layer is a nitride-based semiconductor layer; forming a capping layer of a first conductivity type on the barrier layer; forming a first guard ring of the first conductivity type on the barrier layer; forming a second guard ring of the first conductivity type on the barrier layer, the second guard ring being spaced apart from the first guard ring; forming a source electrode and a drain electrode on the channel layer, the drain electrode being spaced apart from the source electrode; and forming a gate electrode on the capping layer.

In the present disclosure, the first guard ring may be formed substantially simultaneously with the capping layer.

In the present disclosure, forming the capping layer and the first guard ring may include: forming a first doped layer on the barrier layer; and etching a first surface of the first doped layer by utilizing a mask pattern.

In the present disclosure, forming the second guard ring may include: forming a second doped layer between the capping layer and the first guard ring when the first doped layer is etched, the second doped layer having a first thickness; and forming the second guard ring having a second thickness less than that of the second doped layer by etching the second doped layer.

According to another embodiment of the present disclosure, a method for manufacturing a power semiconductor device includes: forming a channel layer on or over a substrate; forming a barrier layer on the channel layer; forming a capping layer of a first conductivity type, a first guard ring of the first conductivity type, and a doped region of the first conductivity type on the barrier layer; forming an insulation film layer such that the capping layer, the first guard ring, and the doped region are covered; etching the insulation film layer; forming openings and a second guard ring by etching the doped region and etching a portion at a predetermined position on the barrier layer; forming a source electrode and a drain electrode in the openings and on the channel layer; and forming a gate electrode on the capping layer.

In the present disclosure, the openings and the second guard ring may be formed by performing a non-selectivity etching process on the barrier layer and the doped region.

In the present disclosure, the second guard ring may have a bottom surface positioned at a substantially same level as bottom surfaces of the capping layer and the first guard ring, and may have an upper surface positioned at a level lower than upper surfaces of the capping layer and the first guard ring.

In the present disclosure, the doped region may have a thickness less than a thickness of the barrier layer.

According to the above configurations, the present disclosure offers several advantages, as described below.

First, the formation of multiple guard rings between the gate electrode and the drain electrode injects holes in the channel layer, captures trapped electrons, and prevents the current collapse effect, resulting in improved reliability of the device by reducing the concentration of the electric field at the edge side of the drain electrode.

Second, the addition of a first guard ring between the gate electrode and the drain electrode reduces the memory effect, as holes injected in the channel are coupled to trapped electrons and electrical resistance of the device is reduced.

Third, the formation of a second guard ring between the gate electrode and the drain electrode allows for control of impact ionization by adjusting the thickness of the ring, reduces the concentration of the electric field at the edge side of the drain electrode, and improves breakdown voltage characteristics.

Fourth, the simultaneous formation of the first guard ring with the capping layer prevents process efficiency deterioration.

Finally, the simultaneous formation of the second guard ring when the barrier layer at the positions corresponding to the source electrode and the drain electrode is etched prevents process efficiency deterioration maximally.

Meanwhile, even if not explicitly mentioned, effects described in the present specification and any potential effects, expected from the technical features of the present specification, will be considered as described in the present disclosure.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Hereinafter, embodiments of the present disclosure will be described in detail with reference to accompanying drawings. Various changes to the following embodiments are possible and the scope of the present disclosure is not limited to the following embodiments. The patent right of the present disclosure should be defined by the scope and spirit of the present disclosure as disclosed in the accompanying claims. In addition, embodiments of the present disclosure are intended to fully describe the present disclosure to a person having ordinary knowledge in the art to which the present disclosure pertains.

Hereinafter, when it is described that a component (or a layer) is referred to as being on another component (or another layer), it should be understood that the component is directly on the other component, or one or more intervening components (or layers) are also present. In contrast, when it is described that a component is referred to as being directly on to another component, it should be understood that there is (are) no intervening component(s) present. In addition, the terms indicating positions, such as, being located 'on', 'upper', 'lower', 'upper side', 'lower side', 'first side', and 'side surface' are intended to mean a relative position of the components.

The terms 'first', 'second', 'third', etc. may be used to describe various items, such as various elements, regions, and/or parts, but the items are not limited by the terms.

In addition, when a specific embodiment may be implemented differently, a specific process order may be performed differently from the described order. For example, two consecutively described processes may be performed substantially at the same time or performed in an order different from the described order.

In addition, conductivity types or doped areas of elements may be defined as 'p-type' or 'n-type' according to main carrier characteristics, but this is only for convenience of description, and the technical idea of the present disclosure is not limited thereto. For example, hereinafter, the 'p-type' or 'n-type' will be referred to as more general terms a 'first conductivity type' or 'second conductivity type'. Herein, the first conductivity type may refer to p-type conductivity, and the second conductivity type may refer to n-type conductivity.

Figure 2:
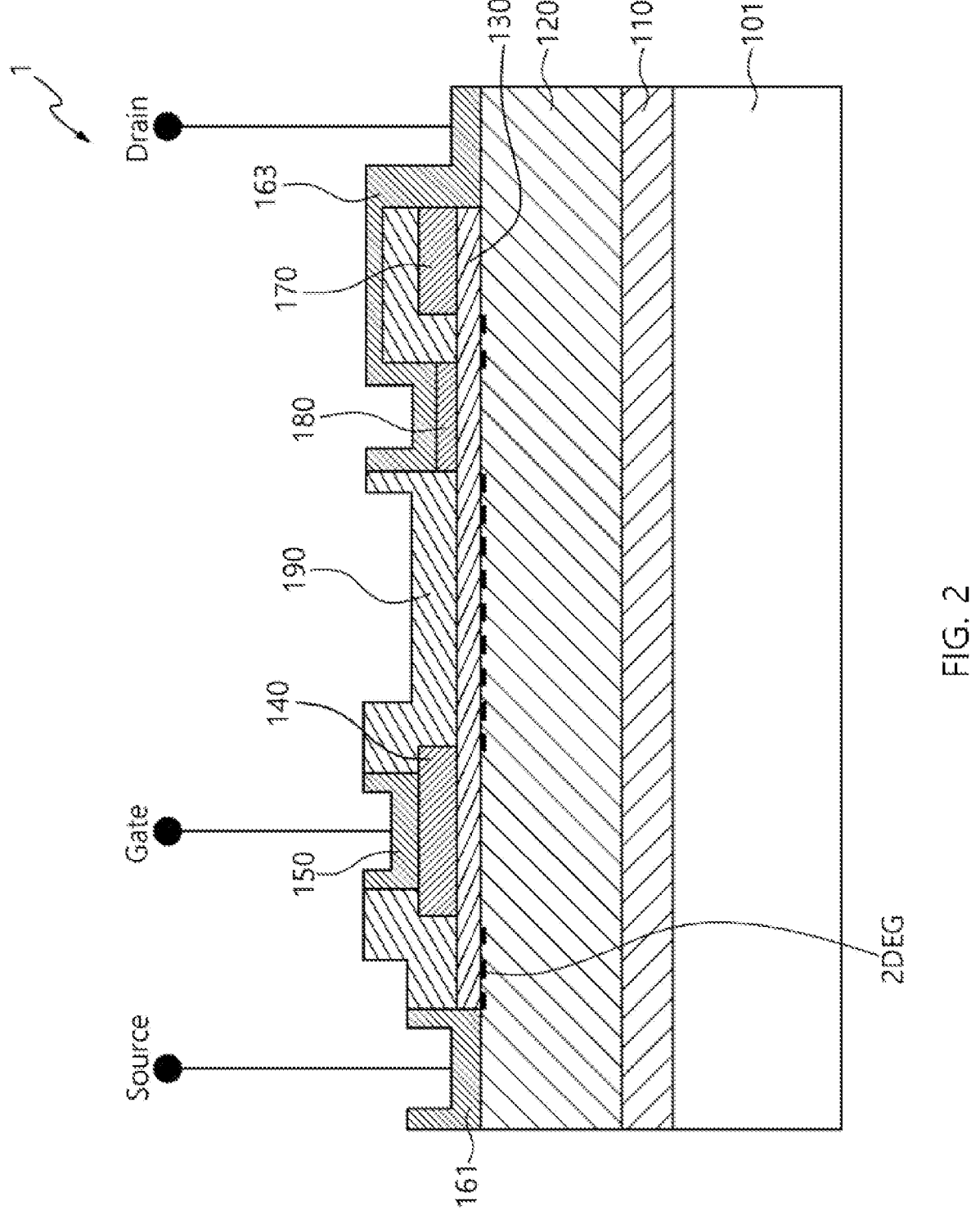
FIG. 2 is a cross-sectional view illustrating a power semiconductor device according to an embodiment of the present disclosure.

FIG. 2 is a cross-sectional view illustrating a power semiconductor device according to an embodiment of the present disclosure.

Hereinafter, a power semiconductor device 1 according to an embodiment of the present disclosure will be described in detail with reference to the accompanying drawings.

Referring to FIG. 2, the present disclosure pertains to a power semiconductor device 1, and more specifically to a power semiconductor device 1 and its manufacturing method. The device 1 features a plurality of guard rings formed in a separation space between a gate electrode 150 and a drain electrode 163. These guard rings are designed to inject holes in a channel layer (for example, a 2 DEG layer that will be described later), which helps capture trapped electrons and prevent a current collapse effect. By reducing the concentration of the electric field at the edge side of the drain electrode 163, this power semiconductor device 1 is able to ensure device reliability.

To this end, the power semiconductor device 1 may include a substrate 101, a buffer layer 110, a channel layer 120, a barrier layer 130, a capping layer 140, the gate electrode 150, a source electrode 161, the drain electrode 163, a first guard ring 170, a second guard ring 180, and an insulation film 190.

The substrate 101 is a substrate for growth, and may be a silicon substrate as an example, but is not limited thereto. As another example, the substrate 101 may be a sapphire substrate, a GaN substrate, or a SiC substrate. In the present disclosure, an example in which the substrate 101 is a silicon substrate will be described.

The buffer layer 110 is a layer formed on the substrate 101 and, for example, may be formed by growing AlN to a predetermined thickness on the substrate 101. Otherwise, the buffer layer 110 may have a form in which at least one composite layer of GaN and AlGaN are grown, but is not limited thereto. Such a buffer layer 110 may have a structure for preventing stress caused by difference in lattice constant values and thermal expansion coefficients between the substrate 101 and the channel layer 120 that will be described later. The buffer layer 110 may be doped with impurities such as C and/or Fe.

The channel layer 120 is formed on the substrate 101. More preferably, the channel layer 120 is formed on the buffer layer 110. For example, the channel layer 120 may be formed of a nitride-based semiconductor layer such as GaN and so on. In addition, the barrier layer 130 is formed on the channel layer 120, and may be a nitride-based semiconductor layer such as AlGaN and so on as an example. It is preferable that such a channel layer 120 and such a barrier layer 130 are formed of different nitride-based semiconductor layers. With this structure, a 2-Dimensional Electron Gas (2 DEG) layer can be formed near an interface between the channel layer 120 and the barrier layer 130. However, it is important to note that the 2 DEG layer may not be present in all regions of the channel layer 120. The density and mobility of the 2 DEG layer can be controlled by adjusting the content of Al and Ga in the barrier layer 130. The 2 DEG layer may be formed in certain regions of the channel layer 120.

An etching stop film (not illustrated) may be formed on an upper surface of the barrier layer 130, and the etching stop film may be formed by growing an AlN epitaxial layer. In addition, the barrier layer 130 may be at least partially not formed on bottom portions of the source electrode 161 and the drain electrode 163. That is, bottom surfaces of the source electrode 161 and the drain electrode 163 may not contact the barrier layer 130 and may directly contact the channel layer 120. For example, the bottom surface of the source electrode 161 may contact the channel layer 120 and the bottommost surface of the drain electrode 163 may contact the channel layer 120, but the scope of the present disclosure is not limited thereto.

The capping layer 140 is configured such that the capping layer 140 is formed below the gate electrode 150 on the barrier layer 130 or the etching stop film. For example, it is preferable that the capping layer 140 is a first-conductivity-type doping region and has a positive polarity. When the capping layer 140 is formed such that the capping layer 140 has a predetermined thickness or more, a distance from the gate electrode 150 to the 2 DEG layer increases, so that a response speed is reduced. Conversely, when the capping layer 140 is formed such that the capping layer 140 has the predetermined thickness or less, a normally-off operation is difficult to be performed. Therefore, preferably, the capping layer 140 has an appropriate thickness, and the appropriate thickness is within a range of 10 nm to 1000 nm, but there is no limitation. In addition, the capping layer 140 may be formed by growing p-GaN and, as an example, the capping layer 140 may be formed by doping Mg in GaN.

The capping layer 140 is substantially formed only at a bottom portion of the gate electrode 150, and the 2 DEG layer is formed such that the 2 DEG layer does not exist below the capping layer 140 when no operation is performed. Therefore, when a gate voltage is turned-off, the 2 DEG layer does not exist in the channel layer 120 and the normally-off operation is performed. When the gate voltage is turned-on, the 2 DEG layer is formed and can be operated. Such a capping layer 140 may be formed of the same material as the first guard ring 170 that will be described later or may include the same material, and it is preferable that the capping layer 140 is formed substantially simultaneously with the first guard ring 170 in the same process. Therefore, the capping layer 140 may be formed substantially flat such that the capping layer 140 has substantially the same vertical thickness as the first guard ring 170, but the scope of the present disclosure is not limited thereto.

For example, on the barrier layer 130, the gate electrode 150 is a configuration formed on the capping layer 140, and may be formed of a single layer or a composite layer of various arbitrary metals such as Al, Ti, Pd, and so on as an example. In addition, the gate electrode 150 is configured to perform the normally-off operation, and a depletion layer of the gate electrode 150 reaches the channel layer 120 by passing through the barrier layer 130, thereby blocking the 2 DEG layer.

The source electrode 161 and the drain electrode 163 are spaced apart from the gate electrode 150 and are formed as ohmic contact regions on the barrier layer 130, and may be formed in step shapes or quadrangle shapes in cross-section, but it should be noted that the source electrode 161 and the drain electrode 163 may be formed in various other structures. For example, the source electrode 161 and the drain electrode 163 may be formed such that at least each first side thereof has a stepped structure along a horizontal direction, and the gate electrode 150 may also be similarly formed. In addition, the source electrode 161, the gate electrode 150, and the drain electrode 163 may be formed to be spaced apart from each other sequentially along the horizontal direction. In addition, as an example, the source electrode 161 and the drain electrode 163 may be formed of single layers or composite layers of various arbitrary metals such as Ti, Au, Al, and so on capable of making ohmic contact, but there is no limitation.

In addition, the drain electrode 163 may be physically or electrically connected to the first guard ring 170 and the second guard ring 180 that will be described later. The drain electrode 163 may have surfaces that directly contact the first guard ring 170 and the second guard ring 180. For example, a first inner side surface of the drain electrode 163 may contact the first guard ring 170 and a first lower portion of the drain electrode 163 may contact the second guard ring 180, but the scope of the present disclosure is not limited thereto. As another example, the drain electrode 163 may be configured such that the drain electrode 163 does not have surfaces physically and directly contacting the first guard ring 170 and/or the second guard ring 180. It is preferable that the drain electrode 163 is electrically connected to the first guard ring 170 and/or the second guard ring 180.

Hereinafter, before describing features of the present disclosure, problems of a conventional power semiconductor device 9 will be described in detail.

Figure 1:
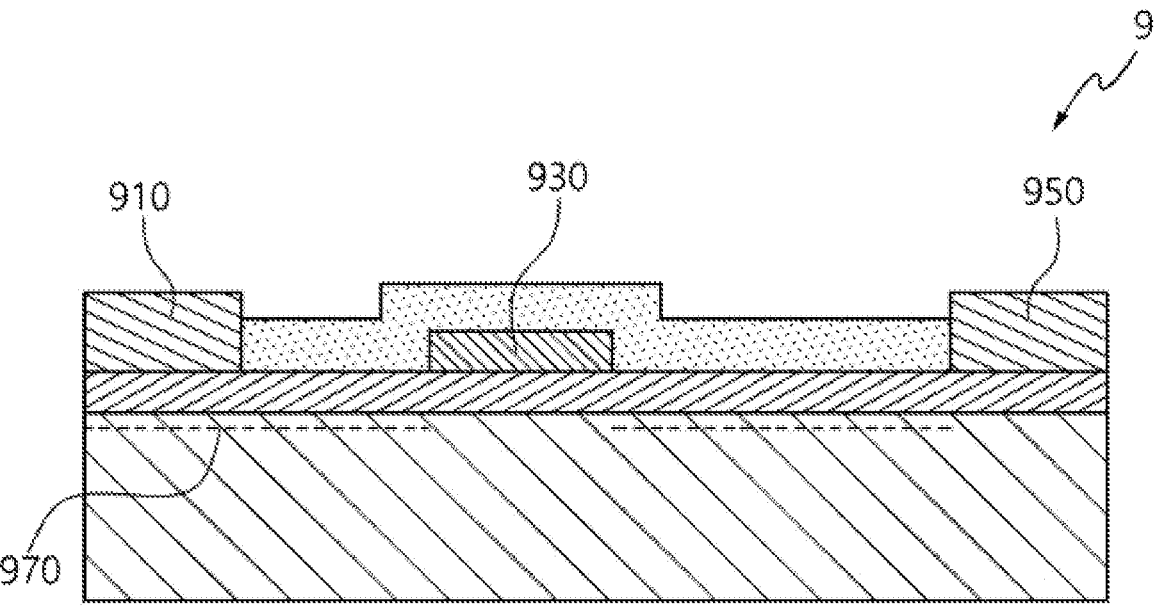
FIG. 1 is a partial cross-sectional view illustrating a conventional power semiconductor device.

Referring to FIG. 1, the conventional power semiconductor device 9 experiences a situation where the drain electrode 950 is subject to a voltage higher than those applied to the source electrode 910 and the gate electrode 930, resulting in carrier trapping between the gate electrode 930 and the drain electrode 950. Such carrier trapping leads to a current collapse effect, which may cause a "memory" effect where the device's conduction current varies depending on the duration of the previously applied voltage. During transistor operation, electrons may be trapped in an epitaxial or dielectric layer, which can hinder current conduction through the 2 DEG layer 970 by pushing electrons moving through the channel. This effect increases the channel's resistance, posing a problem. Referring to FIG. 2, in the power semiconductor device 1 according to an embodiment of the present disclosure, the first guard ring 170 is formed on the barrier layer 130 or the etching stop film to solve this problem. Such a first guard ring 170 has a configuration doped with first conductivity type impurities to inject holes so that electrons trapped at an adjacent side of the barrier layer 130. In addition, the first guard ring 170 may be formed such that the first guard ring 170 contacts the drain electrode 163 from between the drain electrode 163 and the gate electrode 150.

In addition, the first guard ring 170 may be formed by growing p-GaN and, as an example, may be formed by doping Mg in GaN. Furthermore, the first guard ring 170 may be formed substantially simultaneously with the capping layer 140 in the same process. It is preferable that the first guard ring 170 has substantially the same vertical thickness as the capping layer 140. In addition, it is more preferable that the first guard ring 170 extends in a substantially uniform thickness along the horizontal direction. By the formation of the first guard ring 170, holes are injected into a channel and coupled to trapped electrons, so that electrical resistance of a device can be reduced and the memory effect can be minimized.

In addition, in the power semiconductor device 1 according to an embodiment of the present disclosure, the second guard ring 180 is formed on the barrier layer 130 or the etching stop film. It is preferable that the second guard ring 180 is formed between the capping layer 140 and the first guard ring 170 and is spaced apart from the capping layer 140 and the first guard ring 170. The second guard ring 180 is a p-GaN region, and may be formed by doping Mg in GaN as an example. In addition, it is preferable that the second guard ring 180 is formed such that the second guard ring 180 has a vertical thickness that is less than a vertical thickness of the gate electrode 150 and/or a vertical thickness of the first guard ring 170. That is, the second guard ring 180 may be formed such that an upper surface of the second guard ring 180 is positioned at a level lower than an upper surface of a gate electrode 150 and/or an upper surface of the first guard ring 170.

The second guard ring 180 may be formed in different processes with the gate electrode 150 and the first guard ring 170, but it is preferable that the second guard ring 180 is formed in a subsequent process after the gate electrode 150 and the first guard ring 170 are formed. For example, when the channel layer 120 is etched at corresponding positions so as to form the source electrode 161 and the drain electrode 163, a second doped layer or a second doped region D2 deposited on the barrier layer 130 is etched together, and the second guard ring 180 is formed. During this etching process, a non-selectivity etching at the barrier layer 130 and the second doped layer D2 is performed. That is, the barrier layer 130 having a thickness of 140 A to 200 A is formed, and the second doped layer D2 having a thickness of 700 A to 900 A is formed. Furthermore, when sides of the barrier layer 130 where the source electrode 161 and the drain electrode 163 will be formed is etched, the second doped layer D2 may also be etched such that the second doped layer D2 has a thickness of 140 A to 200 A. Therefore, it is preferable that the second doped layer D2 is formed such that the second doped layer D2 has a thickness greater than a thickness of the barrier layer 130.

Therefore, there is an advantage that a thickness of the second guard ring 180 can be controlled according to the degree of etching during the etching process. That is, concentrating of an electric field at an edge side of the drain electrode 163 may be reduced and breakdown voltage characteristics may be improved by controlling an impact ionization. Furthermore, controlling the thickness of the second guard ring 180 also allows for precise control of the amount of current, providing an additional advantage in device performance. As an example, the insulation film 190 is formed of an electrically insulative material, and is formed on the substrate 101. The insulation film 190 may be formed such that the insulation film 190 covers a side exposed to the outside of the first guard ring 170 on the barrier layer 130. That is, the insulation film 190 may be positioned between the first guard ring 170 and the drain electrode 163. The insulation film 190 may have a configuration that includes a first insulation film layer I1 and a second insulation film layer 12.

FIGS. 3 to 14 are cross-sectional views illustrating a manufacturing method of the power semiconductor device according to an embodiment of the present disclosure.

Hereinafter, a manufacturing method of the power semiconductor device according to an embodiment of the present disclosure will be described in detail with reference to the accompanying drawings.

Figure 3:
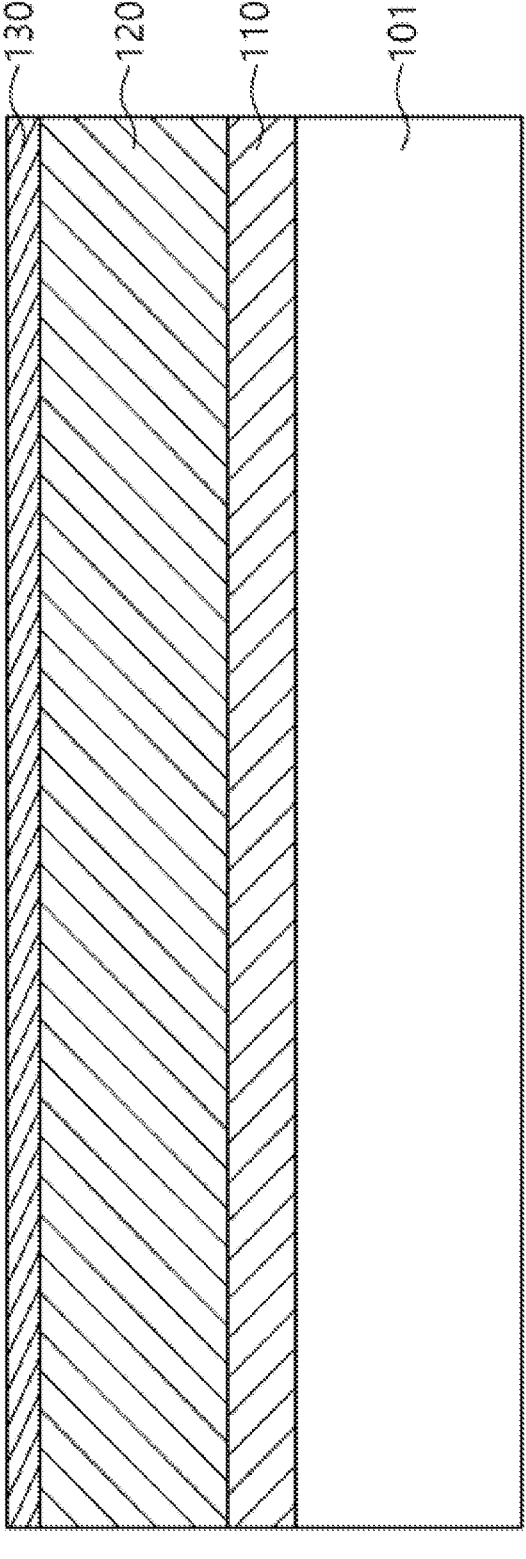
FIGS. 3 to 14 are cross-sectional views illustrating a manufacturing method of the power semiconductor device according to an embodiment of the present disclosure.
Figure 4:
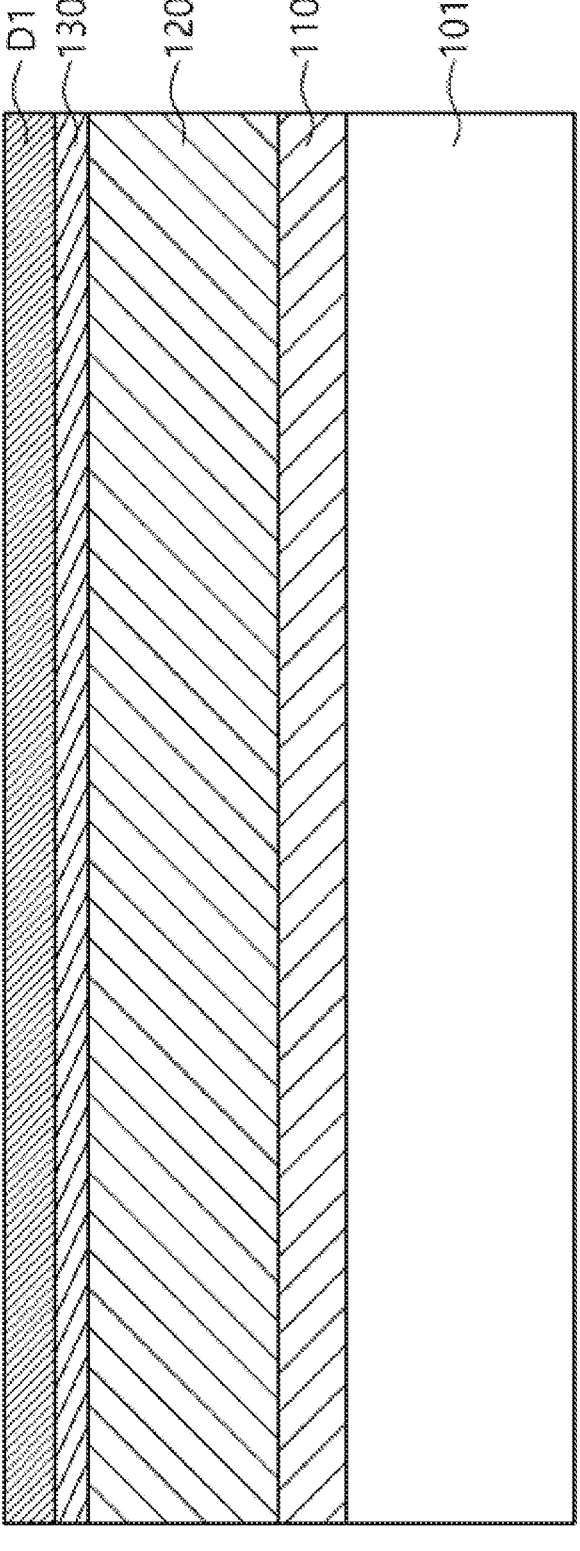
Figure 5:
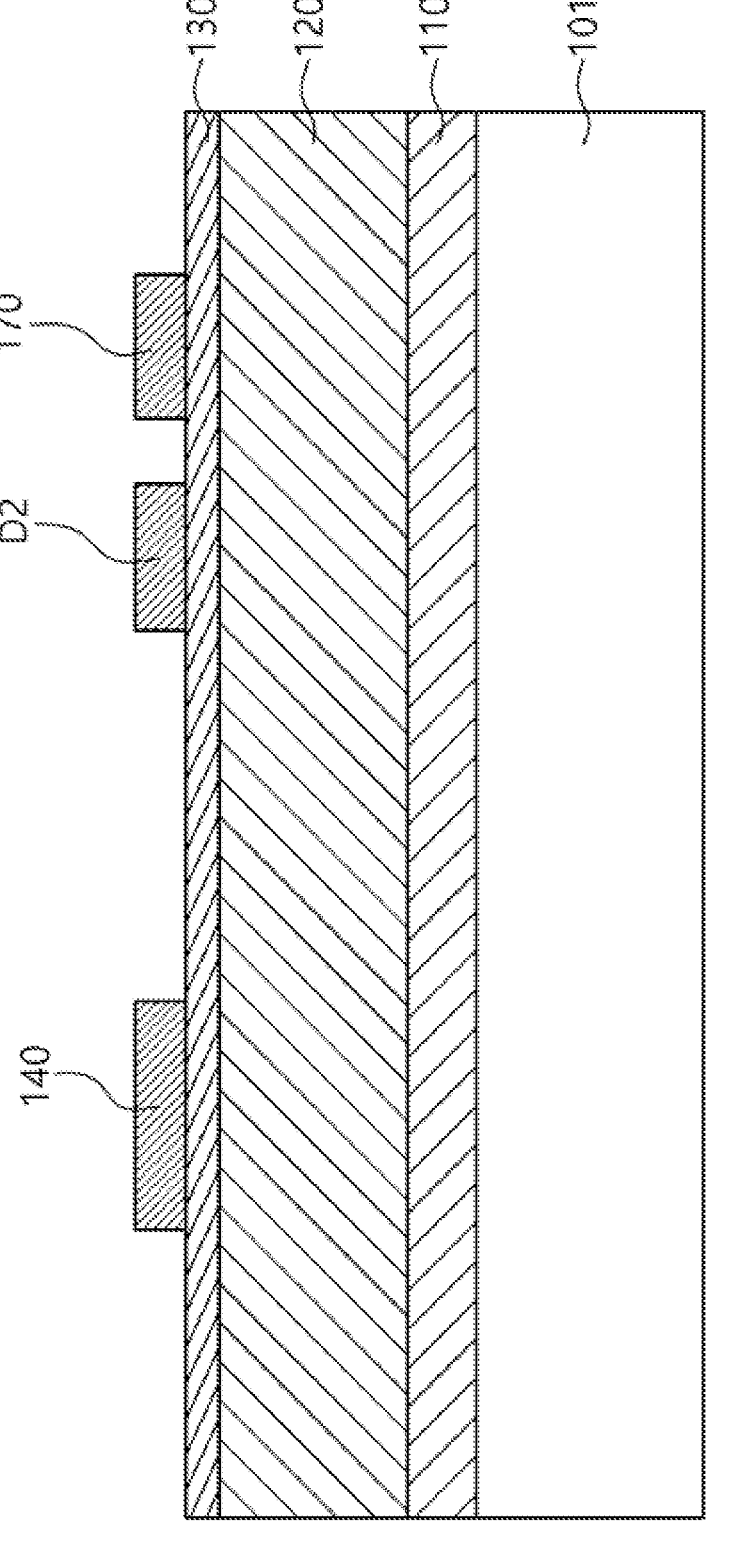

First, referring to FIG. 3, on the substrate 101, the buffer layer 110, the channel layer 120, and the barrier layer 130 are sequentially formed. As described above, the substrate 101 is a substrate for growth, and may be any one of a silicon substrate, a sapphire substrate, a GaN substrate, and a SiC substrate. In the present disclosure, an example in which the substrate 101 is a silicon substrate will be described. The buffer layer 110 may be formed on the substrate 101 and below the channel layer 120 by growing an AlN layer to a predetermined thickness as an example.

In addition, the channel layer 120 formed on the buffer layer 110 is a nitride-based semiconductor layer such as GaN and so on, the barrier layer 130 is a nitride-based semiconductor layer such as AlGaN and so on, and the 2 DEG layer (not illustrated) may be formed by electrons accumulated in an interface between the channel layer 120 and the barrier layer 130. As a detailed description, piezo polarization may occur in the interface between the channel layer 120 and the barrier layer 130 due to the difference in lattice constant between GaN and AlGaN. At this point, both the piezoelectric and spontaneous polarization effects of the channel layer 120 and the barrier layer 130 may act, resulting in the generation of a two-dimensional electron gas with a high electron concentration at the interface between the channel layer 120 and the barrier layer 130. Then, the capping layer 140 and the first guard ring 170 may be formed on the barrier layer 130. In exemplarily describing a formation process of the capping layer 140 and the first guard ring 170, a first doped layer D1 in which GaN is grown as the first conductivity type is formed on the barrier layer 130 (see FIG. 4). As described above, it is preferable that the first doped layer D1 has a thickness larger than a thickness of the barrier layer 130.

Then, by utilizing a mask pattern (not illustrated), the capping layer 140 and the first guard ring 170 may be formed by etching open sides of the first doped layer D1. The open sides of the first doped layer D1 correspond to positions where the first guard ring 170 and the second guard ring 180 will be formed. Therefore, the second doped layer D2 that is a p-GaN region having a vertical thickness greater than a vertical thickness of the second guard ring 180 may be formed at a side where the second guard ring 180 will be formed. The second doped layer D2 is configured such that the second doped layer D2 forms the second guard ring 180 by being partially etched after.

Figure 6:
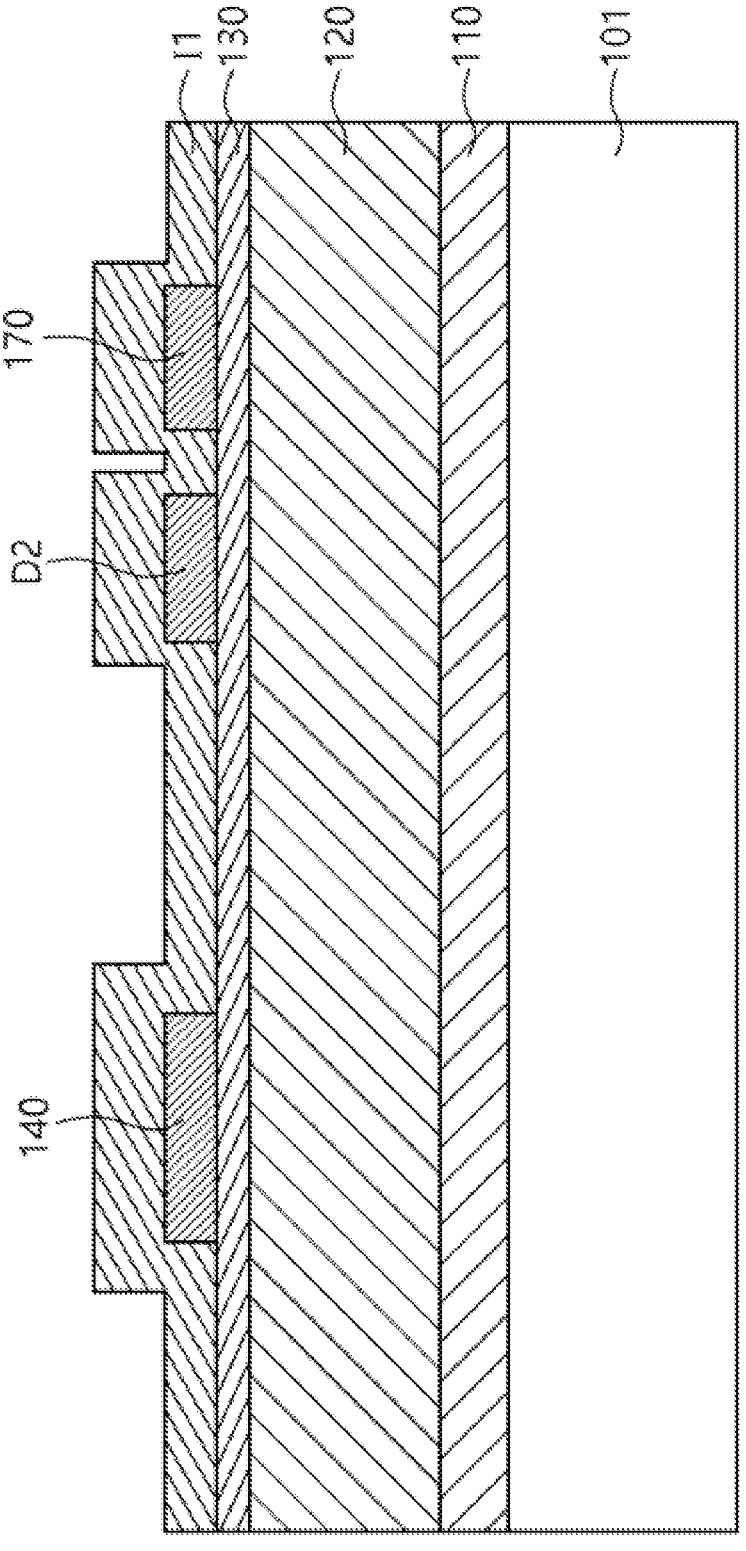

Then, referring to FIG. 6, the first insulation film layer I1 is formed on the barrier layer 130 such that the capping layer 140, the first guard ring 170, and the second doped layer D2 are covered. The first insulation film layer I1 may be formed by depositing Al₂O₃ as an example.

Figure 7:
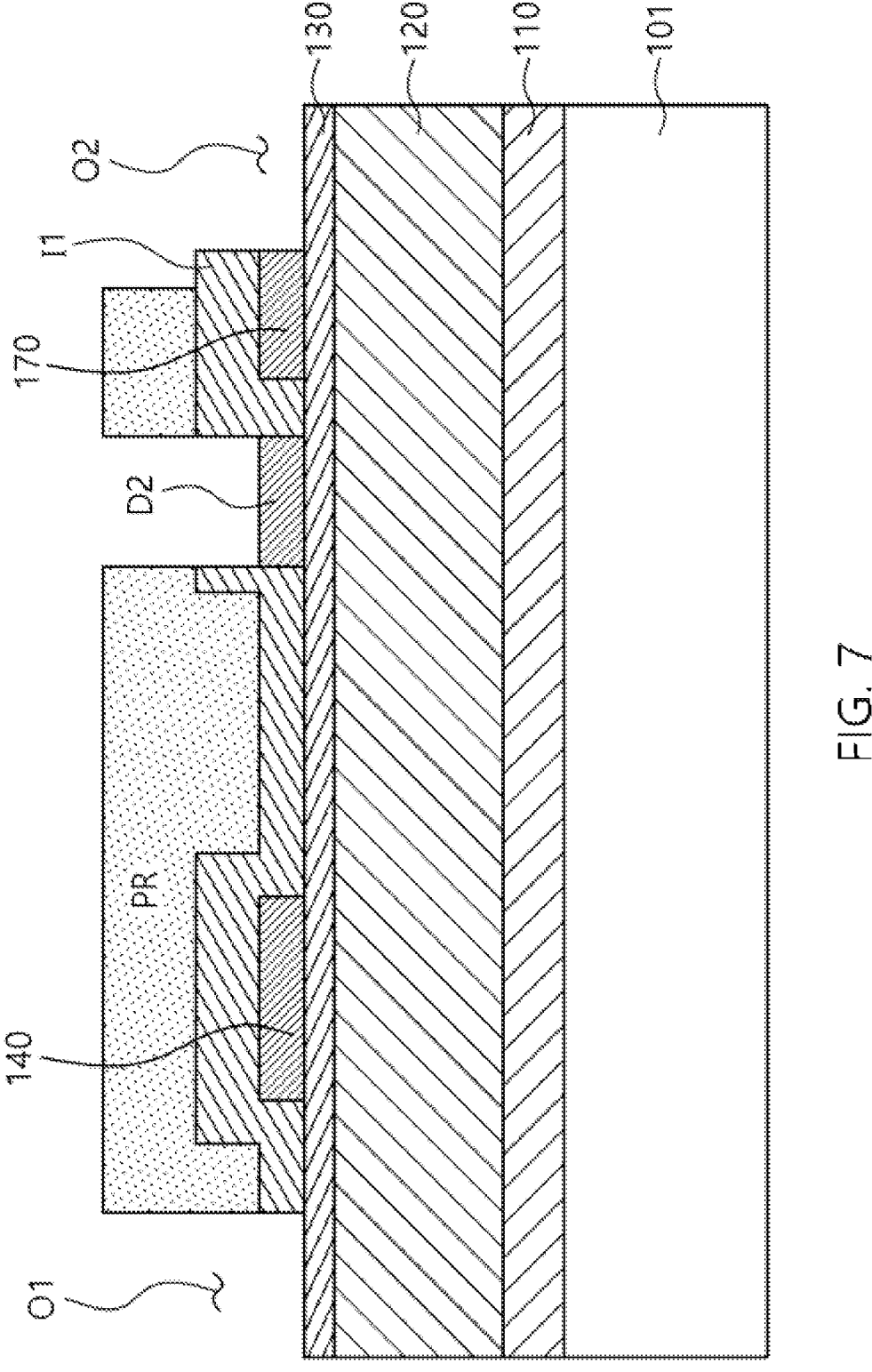

As a subsequent process, referring to FIG. 7, the first insulation film layer I1 deposited on positions where the source electrode 161, the drain electrode 163, and the second guard ring 180 will be formed are etched. After a photoresist pattern PR is formed on the first insulation film layer I1 such that positions where the source electrode 161 and the drain electrode 163 will be formed are open and the second doped layer D2 is open, such an etching process may be performed by utilizing the photoresist pattern as a mask and performing the etching process. By this process, openings O1 and O2 may be formed on positions where the source electrode 161 and the drain electrode 163 will be formed.

Figure 8:
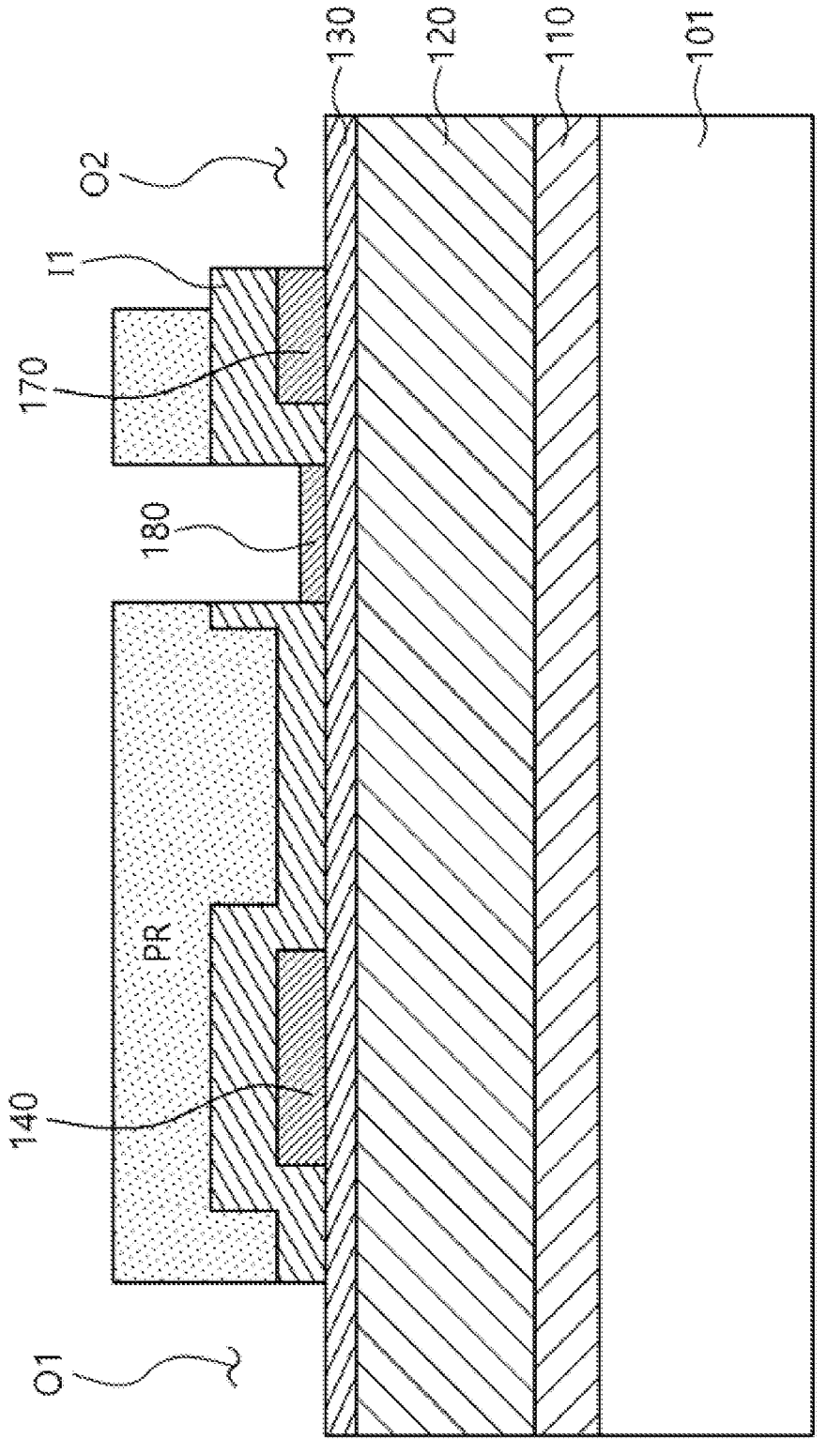
Figure 9:
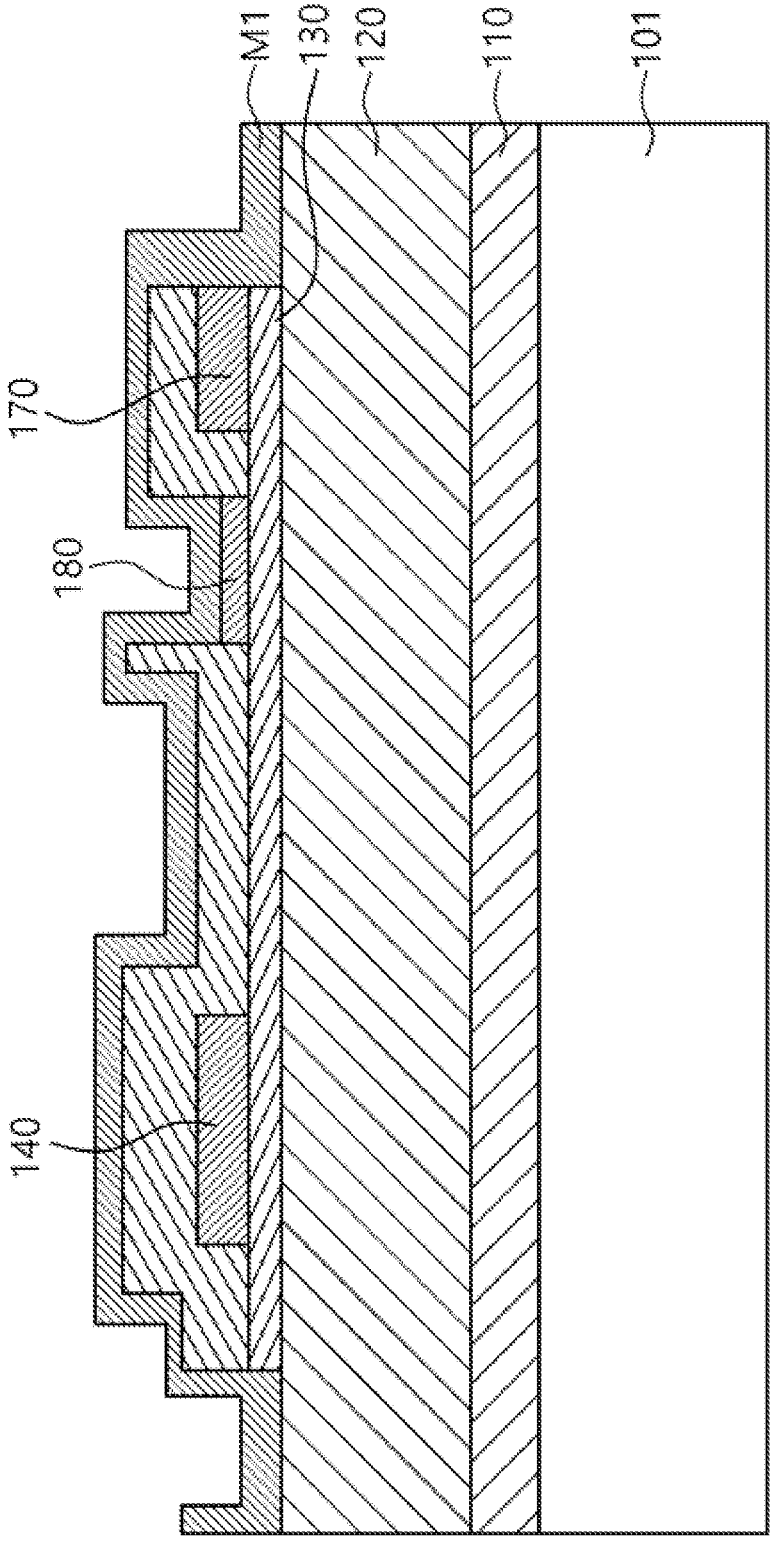
Figure 10:
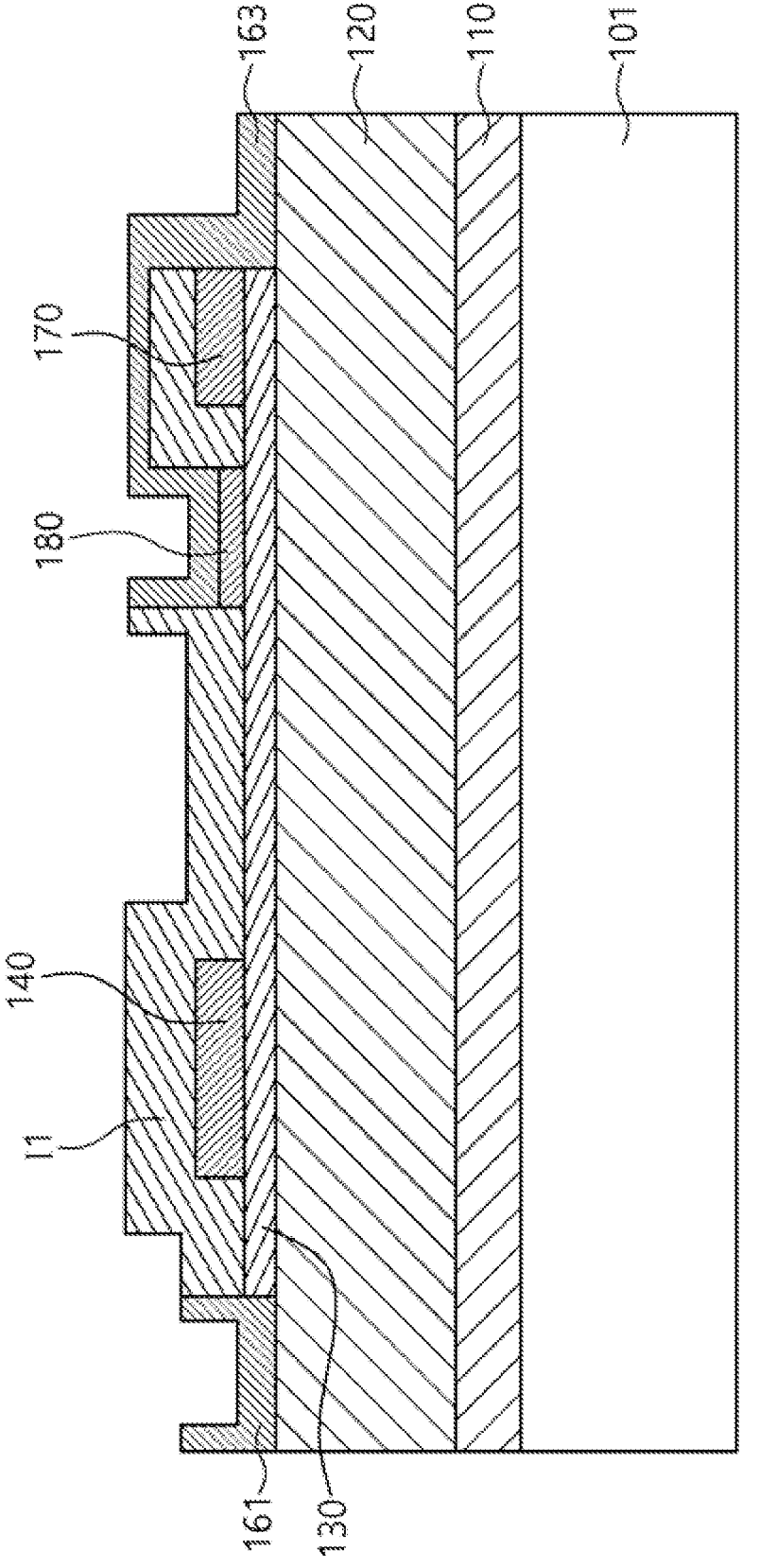

Then, referring to FIG. 8, a non-selectivity etching process for the barrier layer 130 at positions where the second doped layer D2, the source electrode 161, and the drain electrode 163 will be formed may be performed. By this process, the second guard ring 180 may be formed. It is preferable that the second guard ring 180 is formed such that the second guard ring 180 has a vertical thickness less than a vertical thickness of the capping layer 140 and/or a vertical thickness of the first guard ring 170. In addition, when the first insulation film layer I1 is etched, the barrier layer 130 at sides where the source electrode 161 and the drain electrode 163 will be formed may be etched and at least a part of the channel layer 120 may be etched.

After then, the source electrode 161 and the drain electrode 163 are formed. The source electrode 161 may be formed on the channel layer 120, and the drain electrode 163 may be formed such that at least a first side of the drain electrode 163 physically and directly contacts the first guard ring 170. In describing a formation process of the source electrode 161 and the drain electrode 163 more detail, after a first metal layer M1 is deposited on the first insulation film layer I1 so that the openings O1 and O2 are filled, a mask pattern (not illustrated) is formed on the first metal layer M1 (see FIG. 9). In addition, by performing an etching process while utilizing the mask pattern, the first metal layer M1 is partially removed, so that the source electrode 161 and the drain electrode 163 may be formed (see FIG. 10).

Figure 11:
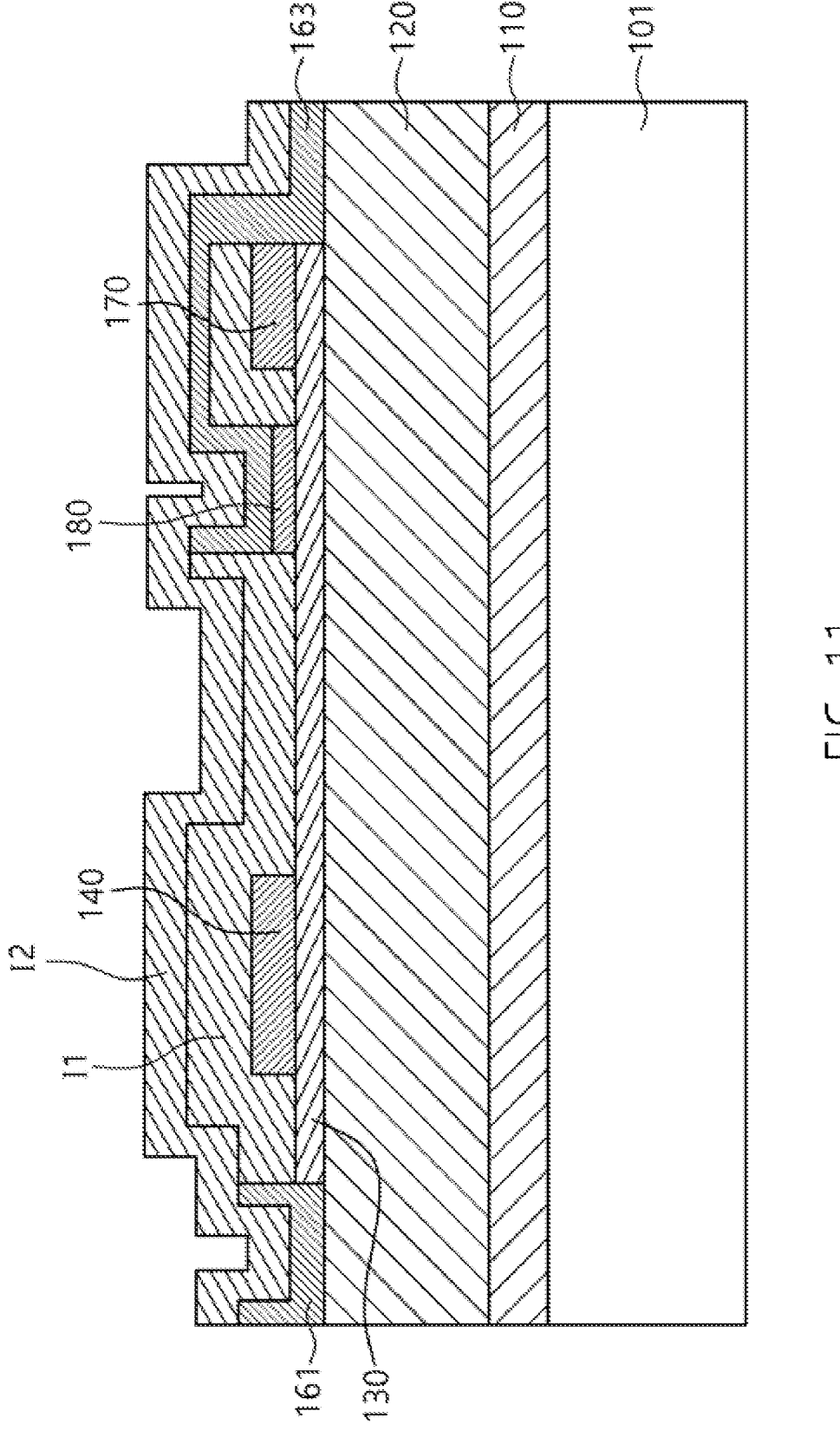
Figure 12:
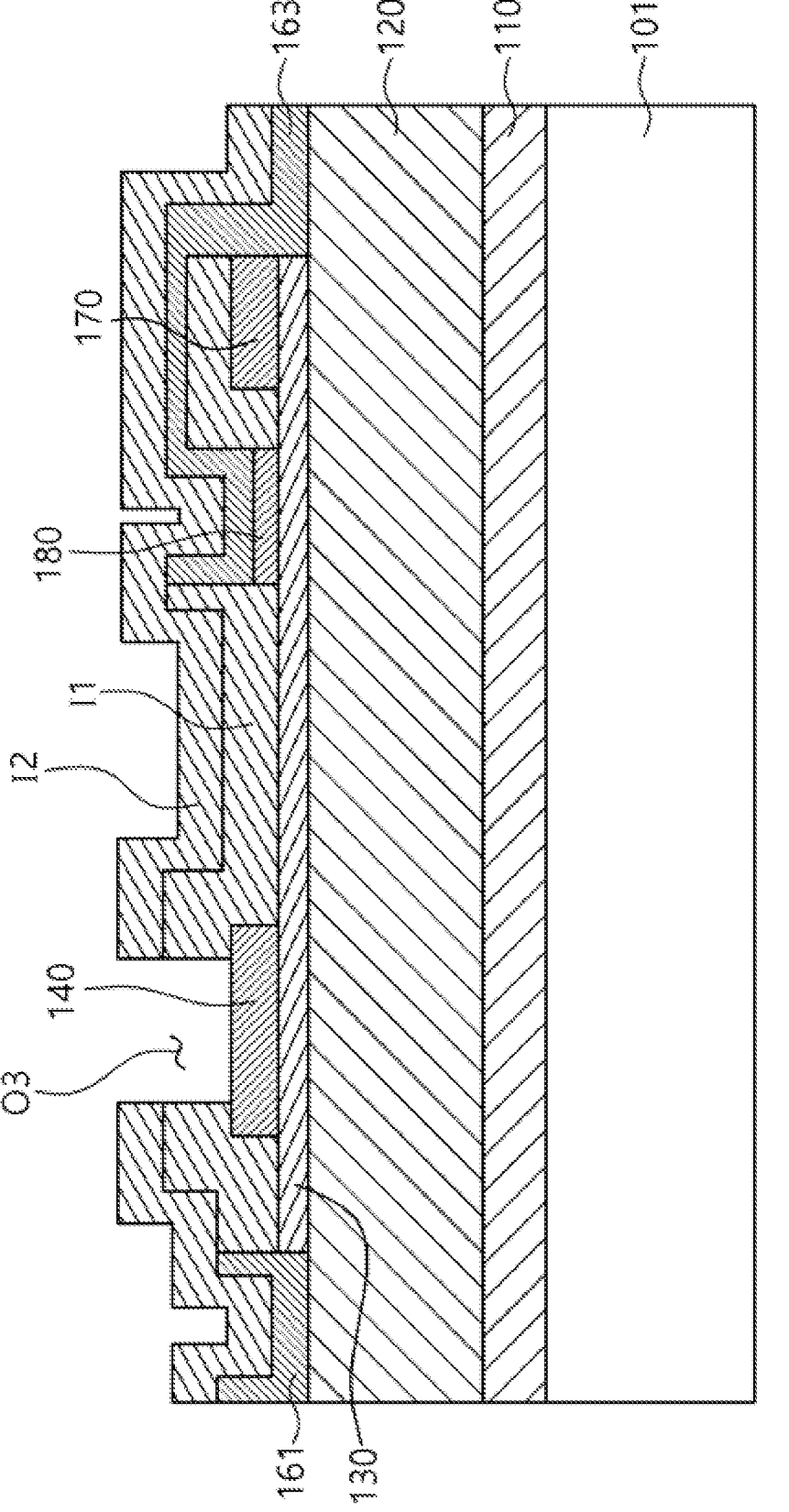
Figure 13:
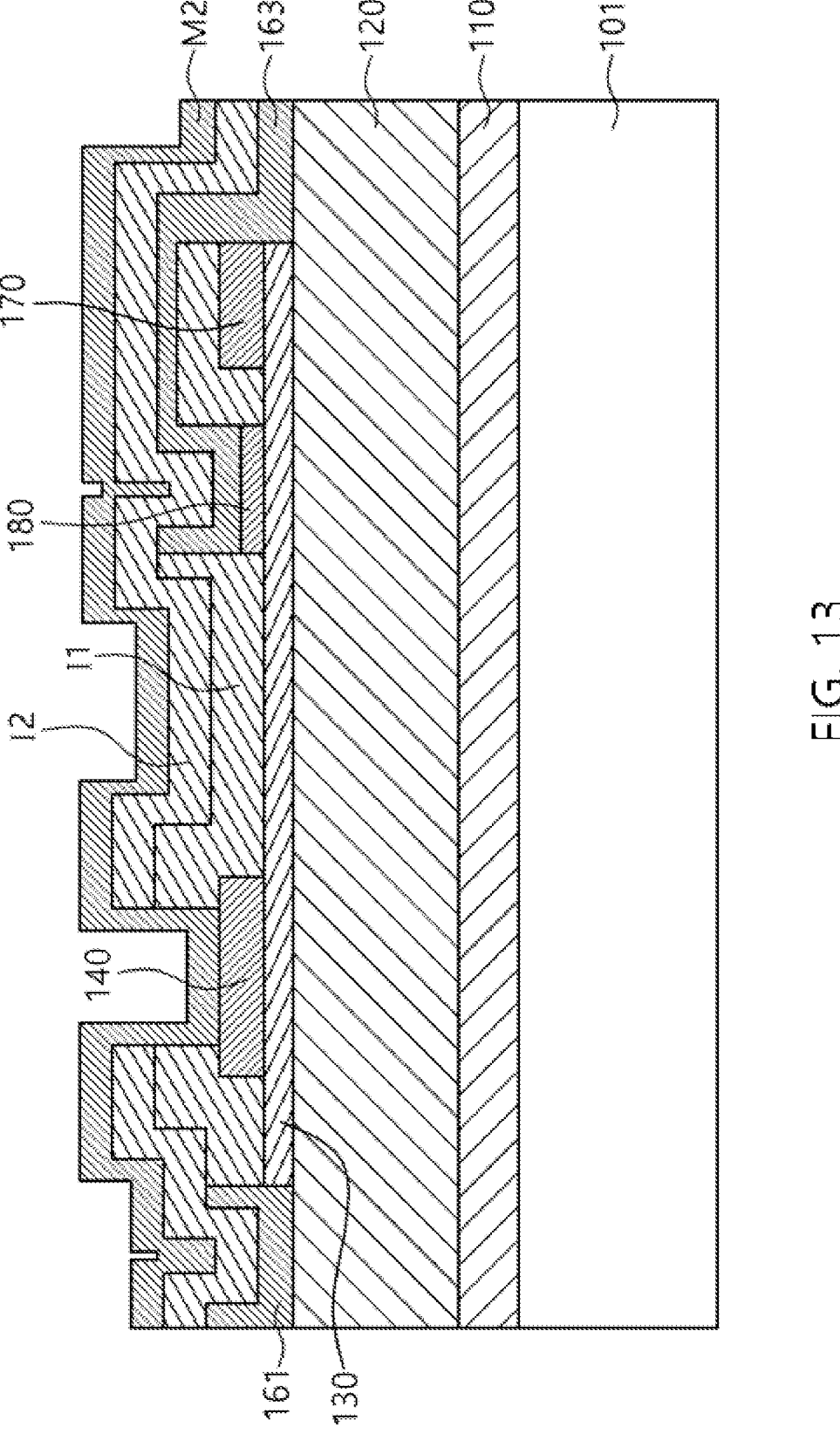
Figure 14:
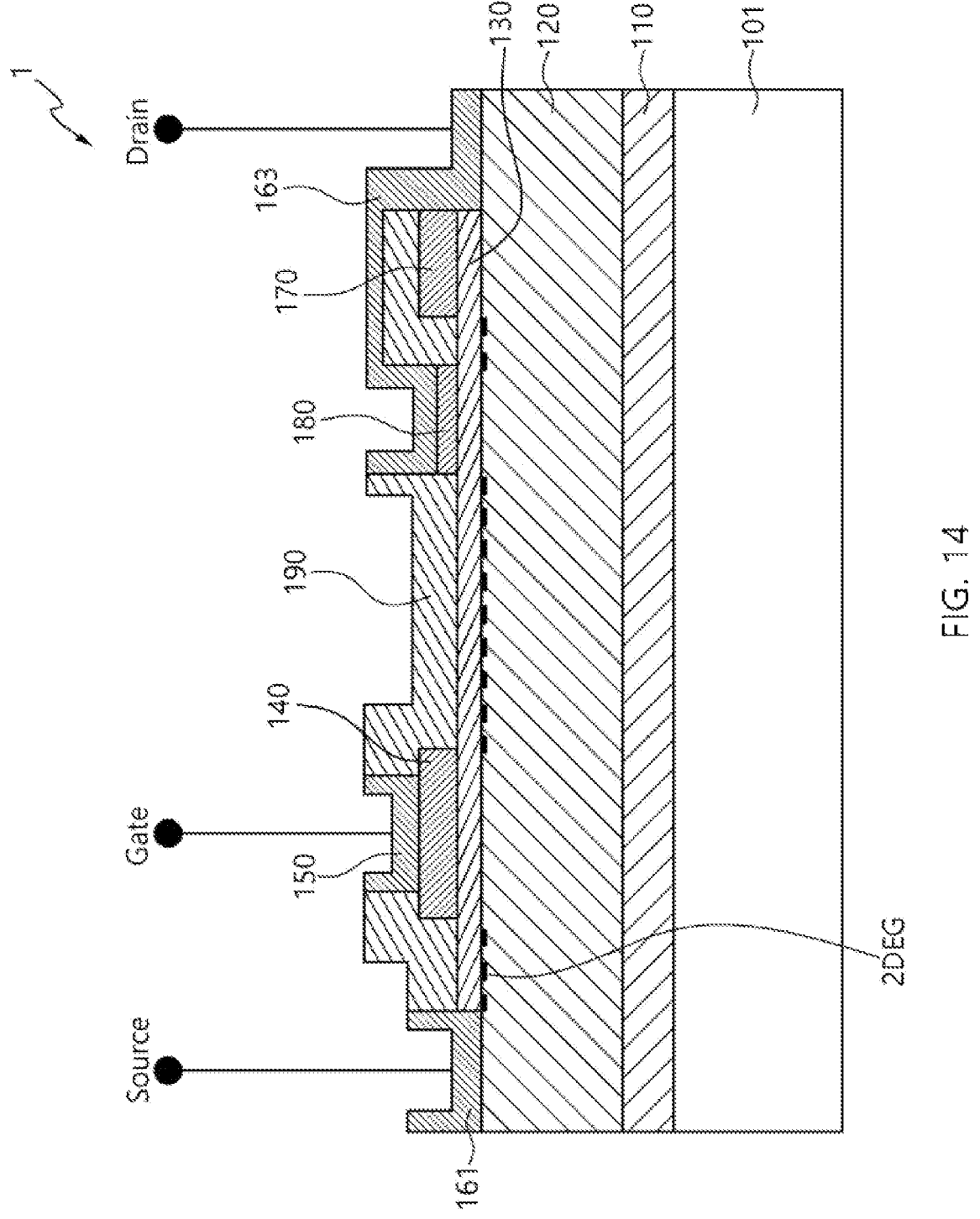

As a subsequent process, the gate electrode 150 is formed. Referring to FIG. 11, after the source electrode 161 and the drain electrode 163 are formed, the additional second insulation film layer 12 is formed on the first insulation film layer I1, the source electrode 161, and the drain electrode 163. Furthermore, referring to FIG. 12, an opening O3 is formed by etching a first side of the second insulation film layer 12 while a mask pattern (not illustrated) is utilized. Such an opening may be formed at a position exposing an upper surface of the capping layer 140 to the outside. Then, an additional second metal layer M2 is formed on the source electrode 161 and the drain electrode 163 so that the opening is filled (see FIG. 13), and the second metal layer M2 is etched by utilizing the mask pattern, so that the gate electrode 150 may be formed (see FIG. 14).

The foregoing detailed description is for illustrative purposes only. Further, the description provides an embodiment of the present disclosure and the present disclosure may be used in other various combination, changes, and environments. That is, the present disclosure may be changed or modified within the scope of the present disclosure described herein, a range equivalent to the description, and/or within the knowledge or technology in the related art. The embodiment shows an optimum state for achieving the spirit of the present disclosure, and various modification required for specific applications and uses of the present disclosure are also possible. Therefore, the detailed description of the present disclosure is not intended to limit the present disclosure in the embodiment.

What is claimed is:

1. A power semiconductor device comprising:
a substrate;
a channel layer disposed on or over the substrate;
a barrier layer disposed on the channel layer;
a capping layer disposed on the barrier layer;
a gate electrode disposed on the capping layer;
a source electrode and a drain electrode that are separated from the gate electrode, the source electrode and the drain electrode forming ohmic contact regions on the channel layer;
a first guard ring of a first conductivity type disposed on the barrier layer, the first guard ring being disposed between the gate electrode and the drain electrode; and
a second guard ring of the first conductivity type disposed on the barrier layer, the second guard ring being disposed between the gate electrode and the first guard ring,
wherein the drain electrode has a first surface directly contacting the first guard ring and a second surface directly contacting the second guard ring.

2. The power semiconductor device of claim 1, wherein the second guard ring is spaced apart from the first guard ring.

3. The power semiconductor device of claim 1, wherein the second guard ring has a thickness less than a thickness of the first guard ring.

4. The power semiconductor device of claim 3, wherein the second guard ring has an upper surface positioned at a level lower than positions of upper surfaces of the first guard ring and the gate electrode.

5. The power semiconductor device of claim 1, wherein the drain electrode is electrically connected to the first guard ring and the second guard ring.

6. The power semiconductor device of claim 1, wherein at least a portion of a bottom surface of the source electrode is in direct contact with the channel layer, and at least a portion of a bottom surface of the drain electrode is in direct contact with the channel layer.

7. The power semiconductor device of claim 1, wherein the first guard ring and the second guard ring form doped regions doped with first conductivity type impurities.

8. A power semiconductor device comprising:
a substrate;
a channel layer disposed on or over the substrate, the channel layer having surfaces directly contacting a source electrode and a drain electrode;
a barrier layer disposed on the channel layer;
a capping layer of a first conductivity type disposed on the barrier layer;
a gate electrode disposed on the capping layer;
a first guard ring of the first conductivity type disposed on the barrier layer, the first guard ring being disposed between the gate electrode and the drain electrode; and
a second guard ring of the first conductivity type disposed on the barrier layer, the second guard ring being disposed between the gate electrode and the first guard ring,
wherein the source electrode is disposed on the channel layer, and
wherein the drain electrode has a first surface directly contacting the channel layer, a second surface directly contacting the first guard ring, and a third surface directly contacting the second guard ring.

9. The power semiconductor device of claim 8, wherein the first guard ring is formed substantially simultaneously with the capping layer.

10. The power semiconductor device of claim 8, wherein the second guard ring is formed when the barrier layer on the channel layer is etched.

11. The power semiconductor device of claim 8, wherein the second guard ring has a substantially uniform thickness, and the second guard ring has the thickness less than a thickness of the first guard ring.

12. The power semiconductor device of claim 8, further comprising an insulation film disposed between the first guard ring and the drain electrode.

* * * * *